(12) United States Patent
von Holderberg et al.

(10) Patent No.: US 11,598,506 B2
(45) Date of Patent: Mar. 7, 2023

(54) LUMINOUS FILM HAVING MICROOPTICAL STRUCTURE

(71) Applicant: LightnTec GmbH, Karlsruhe (DE)

(72) Inventors: Lutz Nehrhoff von Holderberg, Karlsruhe (DE); Florian Kall, Karlsruhe (DE)

(73) Assignee: LightnTec GmbH, Karlsruhe (DE)

( * ) Notice: Subject to any disclaimer, the term of this patent is extended or adjusted under 35 U.S.C. 154(b) by 0 days.

(21) Appl. No.: 17/649,348

(22) Filed: Jan. 28, 2022

(65) Prior Publication Data

US 2022/0154911 A1   May 19, 2022

Related U.S. Application Data

(63) Continuation of application No. PCT/EP2020/071906, filed on Aug. 4, 2020.

(30) Foreign Application Priority Data

Aug. 5, 2019  (DE) ..................... 10 2019 211 703.1

(51) Int. Cl.
| | |
|---|---|
| *F21V 5/00* | (2018.01) |
| *F21V 7/00* | (2006.01) |
| *F21Y 115/10* | (2016.01) |
| *G10K 11/162* | (2006.01) |
| *G10K 11/20* | (2006.01) |

(52) U.S. Cl.
CPC ................ *F21V 5/002* (2013.01); *F21V 7/00* (2013.01); *F21Y 2115/10* (2016.08); *G10K 11/162* (2013.01); *G10K 11/20* (2013.01)

(58) Field of Classification Search
CPC ......... F21V 5/002; F21V 7/00; F21Y 2115/10
See application file for complete search history.

(56) References Cited

U.S. PATENT DOCUMENTS

| | | | |
|---|---|---|---|
| 2010/0226117 A1* | 9/2010 | Krans | G09F 13/22 28/100 |
| 2015/0144920 A1* | 5/2015 | Yamazaki | G06F 3/0445 257/40 |
| 2015/0360606 A1* | 12/2015 | Thompson | B60Q 3/745 362/490 |
| 2017/0254518 A1 | 9/2017 | Vasylyev | |
| 2018/0024575 A1 | 1/2018 | De Potter | |
| 2018/0087765 A1* | 3/2018 | Horter | F21V 33/0008 |
| 2018/0245754 A1 | 8/2018 | Gensler et al. | |

FOREIGN PATENT DOCUMENTS

| | | |
|---|---|---|
| DE | 10 2012 223 162 A1 | 6/2014 |
| DE | 10 2017 003 362 A1 | 10/2018 |
| FR | 2 992 401 A1 | 12/2013 |
| WO | 2011/114263 A2 | 9/2011 |
| WO | 2014/155237 A1 | 10/2014 |
| WO | 2015/176972 A1 | 11/2015 |
| WO | 2016/131819 A1 | 8/2016 |

* cited by examiner

*Primary Examiner* — Evan P Dzierzynski
(74) *Attorney, Agent, or Firm* — Orbit IP

(57) ABSTRACT

A luminous film has a plurality of light-emitting diodes, a carrier layer and a light-conducting layer having microoptical structures which make it possible to deflect multidirectionally emitted light in a common emission direction of the luminous film, in order to allow uniform illumination of the luminous film surface with a low light-emitting diode population of the luminous film.

18 Claims, 2 Drawing Sheets

LUMINOUS FILM HAVING MICROOPTICAL STRUCTURE

CROSS-REFERENCE TO RELATED APPLICATIONS

This continuation application claims priority to PCT/EP2020/071906 filed on Aug. 4, 2020 which has published as WO 2021/023743 A1 and also the German application number 10 2019 211 703.1 filed on Aug. 5, 2019, the entire contents of which are fully incorporated herein with these references.

DESCRIPTION

Field of the Invention

The invention relates to a multilayer luminous film having a plurality of light-emitting diodes, a conductor layer for the electrical connection of the light-emitting diodes and a carrier layer, as is sufficiently well known from the prior art.

Background of the Invention

Conventional luminous films are produced by covering a flexible carrier material with light-emitting diodes. The uniform illumination of the films depends substantially on the number of light-emitting diodes on the carrier material and their spacing from one another. The fill factor is the measure of the extent to which the carrier material is filled with light-emitting diodes. If the greatest possible uniformity in light emission is to be achieved, this leads either to the greatest possible fill factor, i.e., a very large number of light-emitting diodes and very small spacing between the light-emitting diodes, or to additional diffusely translucent layers that scatter the light entering the diffuser.

While increasing the number of light-emitting diodes increases the electrical power consumption of the luminous film and thus the thermal loads, additionally attached diffuser layers lead to a strong increase in the film thickness and to a weakening of luminosity. Both approaches are therefore usually used in combination, but this does not produce satisfactory results.

Both of the usual solutions lead to increased manufacturing costs and increased power consumption by the film. Moreover, another disadvantage of conventional luminous films having a large number of light-emitting diodes is the implementation of associated measures for cooling the luminous film, which in turn leads to a reduction in the formability of the film. The disadvantageous effect of reduced film formability also occurs all the more in conjunction with thick diffuser layers, which can be up to seven centimeters, and can lead to the complete stiffening of the film. Sometimes diffuser layers are therefore only attached after the positioning of the luminous films.

SUMMARY OF THE INVENTION

Object of the Invention

The object of the invention is to provide a luminous film that, with a low fill factor, i.e., a low density of light-emitting diodes and a small film thickness, allows good deformability and low-loss, homogeneous illumination of the luminous film.

DESCRIPTION OF THE INVENTION

According to the invention, this object is achieved by a luminous film of the type mentioned at the outset, characterized in that the film has a first microoptical layer for generating homogeneous illumination.

The microoptical layer according to the invention has microoptical components that have lens, prism, polarizer, filter, phase plate, mirror, aperture, lattice structures, fibers and/or light guides for directing the light introduced into the microoptical layer. The microoptical components obtain their microoptical function by shaping and/or changing the refractive index of an optically uniform starting material, in particular an acrylic film.

The shaping can be done by means of classic methods such as melting, grinding, drawing, etching, pressing and/or polishing. The enumeration should not be understood to be exhaustive with regard to the methods mentioned.

Using the microoptical components, in particular by arranging a plurality of microoptical structures, the microoptical layer guides the light introduced into the microoptical layer via defined optical paths. An optical path determines the exit point and exit angle of a light beam depending on the entry point and the entry angle. The difference with an ordinary diffuser lies in the inhomogeneous beam guidance through the optical layer, whereas a diffuser is characterized by a homogeneous beam path.

For this purpose, the microoptical layer has a structured surface having repeating microoptical regions. The microoptical regions serve to deflect the light introduced into the microoptical layer at different angles. The microoptical regions are preferably predominantly rotationally symmetrical, in particular circular and/or elliptical, starting from an optical center that is close to, in particular precisely above, a light-emitting diode. The microoptical regions have a larger area than the light-emitting diodes.

The dimensions of the microoptical regions are adapted to the light-emitting diode spacing and can differ in the directions of elongation of the microoptical layer. In particular, the direction-dependent dimension of the microoptical regions corresponds at least to the spacing between the light-emitting diodes in this direction of elongation of the microoptical layer. It can thereby be ensured that the light emitted by the light-emitting diodes is reliably deflected at least up to half of the spacing between the light-emitting diodes.

The light emitted by the light-emitting diodes can be used particularly effectively if the adjacent microoptical regions overlap. As a result, light can be used with very large emission angles.

The microoptical layer can consist of glass, quartz glass, polymers, in particular acrylic, and/or silicon. The use of crystals is also conceivable. By using polymers, the costs for the production of the microoptical layer can be reduced in a particularly advantageous manner.

The term "light-emitting diode" is used here to represent all light-emitting diodes, diode modules, diode components (dies), etc. A person skilled in the art is aware that the use of more specific light-emitting diode dies can lead to modifications of the luminous film according to the invention. The term "light-emitting diode" also refers to all colors of light-emitting diodes and combined colors in light-emitting diode dies.

Preferred embodiments and further developments:

An embodiment is preferred in which the film has a textile layer or a fleece layer on the light-emitting film surface. A textile layer or fleece layer allows particularly homogeneous illumination of the luminous film and also has acoustic advantages.

A preferred further development provides that the textile layer or the fleece layer is formed by flocking the film. By means of flocking, the textile layer or the fleece layer can be produced in a particularly simple and cost-effective manner during the production of the film. It is also conceivable to apply the flocking only at a later point in time after the film has been produced, for example after the film has been installed. As a result, the textile layer or fleece can be protected particularly well against damage.

In a particularly preferred further development, the flocking consists of a mixed granulate of a wide variety of granular bodies and/or fibers. In this way, an irregular design of the flocking can be realized in a particularly advantageous manner, which promotes a particularly high level of sound absorption by the luminous film. Alternatively or additionally, the granulate can consist of translucent, in particular transparent, granular bodies and/or fibers, as a result of which the illumination of the film can also be improved.

As an alternative or in addition to a textile layer, a fleece and/or a woven fabric, a top layer, in particular a silicate render, liquid wallpaper, antibacterial and/or an anti-adhesive layer can be provided.

Furthermore, an embodiment is preferred in which the first microoptical layer predominantly, in particular completely, encloses the light-emitting diodes. As a result, the light emitted by the light-emitting diodes can be directed particularly effectively through the microoptical layer, the loss of light can be reduced and the uniformity of the illumination of the film can be further increased.

The microoptical layer is preferably in the form of a stamped and/or pressed layer. As an alternative or in addition to this, the microoptical layer can be formed in one piece. The microoptical components can be in the form of planar, integrated optics of the microoptical layer.

In a preferred embodiment, the film has a mirror layer that is located behind the light-emitting diodes in the emission direction of the film. Such a mirror layer reflects light emitted counter to the direction of illumination of the luminous film and ensures even more effective and low-loss use of the light emitted by the light-emitting diodes.

In a particularly preferred embodiment, the mirror layer and the carrier layer form a common layer. This allows the film to be produced particularly efficiently and cost-effectively because the mirror layer is already produced during the production of the carrier layer. In this way, the mirror layer can also be made particularly thin.

When using a mirror layer, the microoptical layer can be arranged particularly effectively behind the light-emitting diodes and in front of the mirror layer in the emission direction of the luminous film. As a result, the optical path through the microoptical layer can be lengthened or the microoptical layer can be made particularly thin. In this case, the light emitted by the light-emitting diodes counter to the emission direction of the luminous film is first directed counter to the emission direction of the luminous film to the mirror layer through the microoptical layer. The mirror layer reflects the incoming light in the emission direction of the luminous film, as a result of which the light is guided through the microoptical layer once more to finally emerge on the surface of the luminous film. As a result, the effectiveness of the light guidance by the microoptical layer and the proportion of the light used are further increased.

An embodiment is preferred in which the film has a further microoptical layer having microoptical components, the light-emitting diodes being arranged between the two microoptical layers. As a result, effective light guidance can be implemented in a particularly favorable manner, and the production effort can be reduced to the arrangement of the layers.

An embodiment is particularly preferred in which the carrier layer consists of a film, a fleece and/or a woven fabric, in particular a textile, particularly preferably a paper. This offers the advantage of a wide range of applications because the carrier layer can be adapted to the prevailing conditions at the place of use. In a particular further development, the carrier layer can be translucent, in particular completely transparent. As a result, the luminous effect of the film can be achieved on both sides.

An embodiment is also preferred in which the conductor layer is designed to be partially translucent, in particular completely translucent. The translucency of the conductor layer allows it to be arranged in front of the light-emitting diodes in the emission direction of the luminous film, without the conductor tracks interfering with the luminous effect of the film.

In a preferred embodiment, the conductor layer can consist of copper, electrically conductive ink, indium zinc oxide and/or silver oxide.

Furthermore, an embodiment is preferred in which the textile layer or the fleece layer is oriented to be unidirectionally translucent, in particular in the emission direction of the film. As a result, the luminous effect of the luminous film can be achieved in a particularly uniform manner.

An embodiment is particularly preferred in which the textile layer or the fleece layer is at least in part sonically hard and/or soft. This allows the use of the luminous film in regions having acoustic specifications or to improve the acoustic conditions. Depending on the specification, the textile layer can therefore be designed to be sound-absorbing and/or sound-reflecting.

One embodiment provides for the light-emitting diodes to have a spacing of between 1 millimeter and 200 millimeters, in particular between 4 millimeters and 150 millimeters, particularly preferably between 8 millimeters and 100 millimeters.

In a particular embodiment, the fill factor of the luminous film with homogeneous illumination is between 5 and 50%, in particular between 7 and 25%, particularly preferably between 9 and 15%.

An embodiment is preferred in which the film thickness is 0.1 millimeters to 40 millimeters, in particular 0.2 millimeters to 30 millimeters, particularly preferably 0.3 millimeters to 20 millimeters. The thickness of the film refers to the predominant film thickness without taking an optional textile layer into account.

An embodiment is particularly preferred in which the film is designed to be bendable, in particular rollable. In particular, the bending and/or rolling radius is between 1 centimeter and 10 centimeters, particularly preferably between 2 centimeters and 5 centimeters.

Furthermore, an embodiment is preferred in which the controller of the light-emitting diodes is arranged on, in particular in the film, particularly preferably directly at the light-emitting diodes of the film. A controller arranged in this way simplifies the installation and the delivery of the luminous film and reduces the space required for attaching the luminous film.

Further advantages of the invention can be found in the description and the drawings. Likewise, according to the invention, the aforementioned features and those which are to be explained below can each be used individually for themselves or for a plurality of combinations of any kind. The embodiments shown and described are not to be understood as an exhaustive enumeration but rather have exemplary character for the description of the invention.

DETAILED DESCRIPTION OF THE PREFERRED EMBODIMENTS

Figure 1:
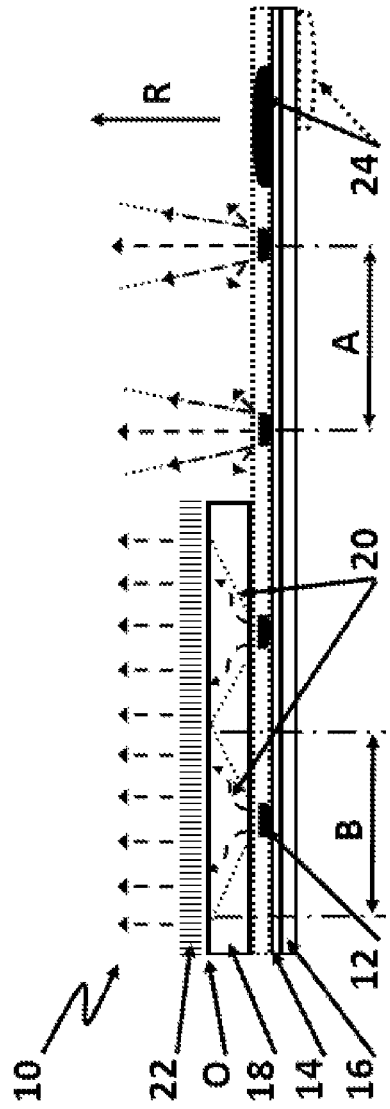
FIG. 1 is a schematic view of a first embodiment of the luminous film according to the invention.

FIG. 1 is the schematic side view of a first embodiment of the luminous film 10 according to the invention with a plurality of light-emitting diodes 12 (for the sake of clarity, only one light-emitting diode has been provided with a reference sign), a conductor layer 14, which electrically connects the light-emitting diodes 12, a carrier layer 16 and a microoptical layer 18.

For a clear representation of the effect of the microoptical layer 18, the schematic figure shows the luminous effect of the light-emitting diodes with and without the microoptical layer 18. The two light-emitting diodes 12, arranged on the right on the conductor layer 14, have a scattering light pattern. Starting from the light-emitting diodes 12, the light is radiated multidirectionally with different intensities. In order to achieve the most homogeneous possible illumination of the luminous film 10, in the prior art either the spacing A of the light-emitting diodes is therefore reduced or a diffuser layer (not shown) is used for light scattering.

On the left side of the schematic figure, a microoptical layer 18 is arranged downstream of the light-emitting diodes 12 in the emission direction R of the film. The microoptical layer 18 has microoptical components through which the multidirectionally emitted light of the light-emitting diodes 12 is coupled into the microoptical layer 18 and guided on optical paths 20 by the microoptical layer 18. The design of the microoptical layer 18 according to FIG. 1 leads to a predominantly unidirectional emission at the exit of the light from the microoptical layer 18. With the same spacing A between the light-emitting diodes, greater homogeneity in the illumination of the luminous film can thus be achieved.

In the embodiment, the light-emitting diode spacing A also corresponds to the width of the microoptical regions B. The microoptical region B includes the region of the microoptical layer 18 in which incoming light is guided to the light-emitting surface via the microoptical structures. FIG. 1 shows adjacent microoptical regions B.

The embodiment according to FIG. 1 also has a textile layer/fleece 22 on the light-emitting film surface O. The use of such a textile layer/fleece 22 additionally improves the homogeneity of the film illumination by scattering the emitted light on the surface. In addition, the luminous film 10 can be designed with regard to acoustic requirements, which further increases the usability of the luminous film 12.

Furthermore, the embodiment has a control unit 24 that is electrically connected to the conductor track structure 14 and serves to control the light-emitting diodes 12. The control unit 24 can be designed as a central control unit 24, as shown, or be decentralized by means of a series of control units close to the light-emitting diodes. Alternatively or additionally, the control unit can be arranged on the film surface, in particular on the carrier layer (shown with dashed lines).

Figure 2:
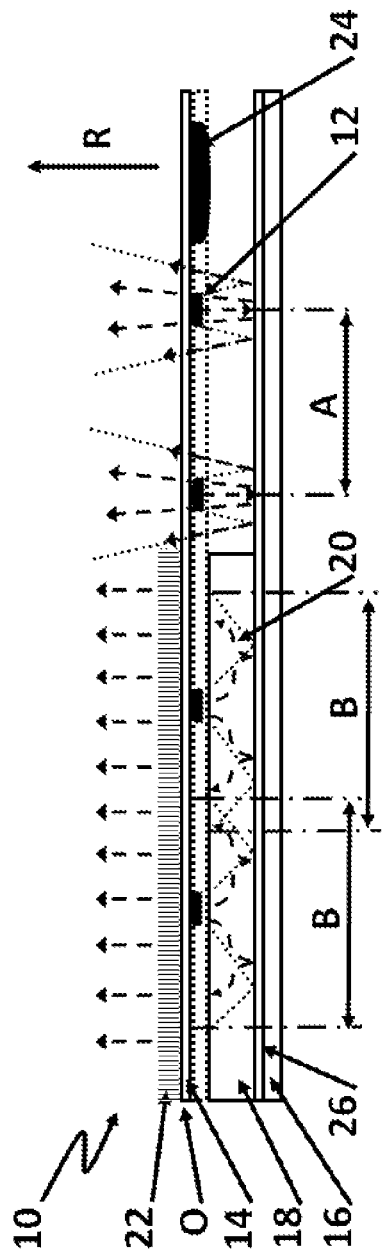
FIG. 2 is a schematic view of a second embodiment of the luminous film according to the invention.

FIG. 2 is a schematic representation of a second embodiment of the luminous film 10 according to the invention. The luminous film 10 has a mirror layer 26 that is arranged behind the light-emitting diodes 12 counter to an emission direction R of the luminous film 10. The microoptical layer 18 is arranged between the light-emitting diodes 12 and the mirror layer 18. The light emitted by the light-emitting diodes 12 counter to the emission direction R of the luminous film 10 is guided counter to the emission direction R through the microoptical layer 18 and reflected on the mirror layer 26. The reflected light is deflected in the emission direction R and guided to the emitting surface O through the microoptical layer 18 in the emission direction R. The light-emitting surface O is in this case formed by a translucent, in particular transparent, conductor layer 14 that is additionally flocked with a textile layer/fleece 22. In this case, with a similar thickness of the microoptical layer as in embodiment 1 (FIG. 1), the optical paths 20 greatly extended by the reflection on the mirror layer 26 become clearly intelligible (for the sake of clarity, only one optical path 20 was given a reference sign).

In addition, the schematic representation of the luminous film 10 shows overlapping microoptical regions B. By overlapping the microoptical regions B, strongly scattering emitted light—which under conventional circumstances counts as a loss— can nevertheless be directed to the light-emitting surface O in a particularly effective manner. This effect is particularly pronounced when the light-emitting diodes 12 are enclosed by the microoptical layer 18.

For clarity, the diagram again shows the beam path under the influence of the microoptical layer 18 (light-emitting diodes 12 on the left in the schematic representation) and without the influence thereof (light-emitting diodes 12 on the right in the schematic representation).

Figure 3:
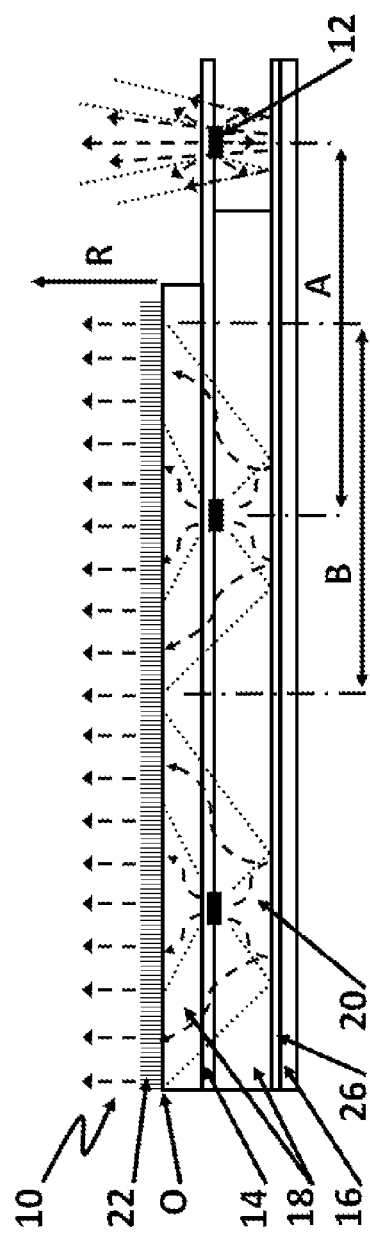
FIG. 3 is a schematic view of a third embodiment of the luminous film according to the invention.

FIG. 3 is a schematic representation of a third embodiment of the luminous film 10 according to the invention. The luminous film 10 has a further microoptical layer 18. The light-emitting diodes 12 and the conductor layer 14 are arranged between the two microoptical layers 18. The conductor layer 14 is translucent, in particular transparent, in order not to disturb the transmission of light. The arrangement of the two microoptical layers 18 allows the formation of a wide microoptical region B and, accordingly, a low density of light-emitting diodes 12—illustrated by the light-emitting diode spacing A—with nevertheless homogeneous illumination of the luminous film 10.

The representation of the luminous film 10 in FIG. 3 also shows that the light emitted by the light-emitting diodes 12 is guided through the microoptical structures of the microoptical layers 18 both when emitted counter to the emission direction R of the luminous film and when emitted in the emission direction R of the luminous film 10 or transversely thereto.

When all the figures of the drawing are viewed together, the invention relates to a luminous film 10 having a plurality of light-emitting diodes 12, a carrier layer 16 and a light-conducting layer 18 made of microoptical structures that make it possible to deflect multidirectional emitted light in a common emission direction R of the luminous film 10 in order to allow uniform illumination of the luminous film surface O with a small number of light-emitting diodes on the luminous film 10.

LIST OF REFERENCE SIGNS 10 luminous film;
12 light-emitting diodes;

14 conductor layer;
16 carrier layer;
18 microoptical layer;
20 optical paths;
22 textile layer/fleece;
24 control unit;
26 mirror layer;
A spacing of the light-emitting diodes;
B width of the microoptical region;
O light-emitting film surface;
R emission direction of the luminous film.

What is claimed is:

1. A multilayer luminous film comprising:
a plurality of light-emitting diodes;
a conductor layer for the electrical connection of the light-emitting diodes; and
a carrier layer;
the multilayer luminous film having a micro-optical layer with micro-optical components for producing homogeneous illumination;
the light-emitting diodes having a spacing of between 8 millimeters and 100 millimeters;
the microoptical layer having a structured surface having repeating microoptical regions;
the microoptical regions being predominantly rotationally symmetrical starting from an optical center, which lies precisely above a light-emitting diode;
the microoptical regions having a larger area than the light-emitting diodes and the luminous film being designed to be rollable, the bending and/or rolling radius being between 1 cm and 10 cm.

2. The multilayer luminous film according to claim 1, wherein the luminous film has a textile layer or a fleece layer on the light-emitting film surface.

3. The multilayer luminous film according to claim 2, wherein the textile layer or the fleece layer is formed by flocking the luminous film, in particular the light-emitting film surface.

4. The multilayer luminous film according to claim 1, wherein the first microoptical layer predominantly encloses the light-emitting diodes.

5. The multilayer luminous film according to claim 1, wherein the first microoptical layer completely encloses the light-emitting diodes.

6. The multilayer luminous film according to claim 1, wherein the luminous film has a mirror layer that is located behind the light-emitting diodes in the emission direction of the luminous film.

7. The multilayer luminous film according to claim 1, wherein the mirror layer and the carrier layer form a common layer.

8. The multilayer luminous film according to claim 1, wherein the luminous film has a further microoptical layer having microoptical components, the light-emitting diodes being arranged between the two microoptical layers.

9. The multilayer luminous film according to claim 1, wherein the carrier layer consists of a film, a fleece and/or a woven fabric, in particular a textile.

10. The multilayer luminous film according to claim 1, wherein the carrier layer consists of a paper.

11. The multilayer luminous film according to claim 1, wherein the conductor layer is designed to be completely translucent.

12. The multilayer luminous film according to claim 1, wherein the conductor layer is designed to be partially translucent.

13. The multilayer luminous film according to claim 1, wherein the conductor layer consists of copper, electrically conductive ink, indium zinc oxide and/or silver oxide.

14. The multilayer luminous film according to claim 1, wherein the textile layer or the fleece layer is oriented to be unidirectionally translucent, in the emission direction of the luminous film.

15. The multilayer luminous film according to claim 1, wherein the textile layer or the fleece layer is at least in part sonically hard and/or soft.

16. The multilayer luminous film according to claim 1, wherein the film thickness is 0.1 millimeters to 40 millimeters.

17. The multilayer luminous film according to claim 1, wherein the film thickness is 0.2 millimeters to 30 millimeters.

18. The multilayer luminous film according to claim 1, wherein the film thickness is 0.3 millimeters to 20 millimeters.

* * * * *